United States Patent
Wu et al.

(10) Patent No.: US 11,903,325 B2
(45) Date of Patent: Feb. 13, 2024

(54) MAGNETIC MEMORY DEVICE HAVING SHARED SOURCE LINE AND BIT LINE

(71) Applicant: UNITED MICROELECTRONICS CORP., Hsin-Chu (TW)

(72) Inventors: Yi-Ting Wu, Tainan (TW); Yan-Jou Chen, Yunlin County (TW); Cheng-Tung Huang, Kaohsiung (TW); Jen-Yu Wang, Tainan (TW); Po-Chun Yang, Tainan (TW); Yung-Ching Hsieh, Tainan (TW); Jian-Jhong Chen, Tainan (TW); Bo-Chang Li, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 92 days.

(21) Appl. No.: 17/735,094

(22) Filed: May 2, 2022

(65) Prior Publication Data
US 2022/0263012 A1 Aug. 18, 2022

Related U.S. Application Data

(63) Continuation of application No. 16/852,542, filed on Apr. 19, 2020, now Pat. No. 11,355,695.

(30) Foreign Application Priority Data

Apr. 1, 2020 (CN) .......................... 202010248863.6

(51) Int. Cl.
*H10N 50/80* (2023.01)
*G11C 11/16* (2006.01)
(Continued)

(52) U.S. Cl.
CPC ........... *H10N 50/80* (2023.02); *G11C 11/161* (2013.01); *G11C 11/1659* (2013.01);
(Continued)

(58) Field of Classification Search
CPC ... H10N 50/80; G11C 11/161; G11C 11/1659; H10B 61/22
See application file for complete search history.

(56) References Cited

U.S. PATENT DOCUMENTS

| 7,133,310 B2 | 11/2006 | Hidaka |
| 9,324,768 B1 | 4/2016 | Zhu |

(Continued)

FOREIGN PATENT DOCUMENTS

| CN | 105321949 A | 2/2016 |
| CN | 110892531 A | 3/2020 |

*Primary Examiner* — Shih Tsun A Chou
(74) *Attorney, Agent, or Firm* — Winston Hsu

(57) ABSTRACT

A memory device includes a substrate; an active area extending along a first direction on the substrate; a gate line traversing the active area and extending along a second direction that is not parallel to the first direction; a source doped region in the active area and on a first side of the gate line; a main source line extending along the first direction; a source line extension coupled to the main source line and extending along the second direction; a drain doped region in the active area and on a second side of the gate line that is opposite to the first side; and a data storage element electrically coupled to the drain doped region. The main source line is electrically connected to the source doped region via the source line extension.

11 Claims, 12 Drawing Sheets

(51) Int. Cl.
*H10B 61/00* (2023.01)
*H10N 50/85* (2023.01)

(52) U.S. Cl.
CPC .......... *H10B 61/22* (2023.02); *G11C 11/1673* (2013.01); *G11C 11/1675* (2013.01); *H10N 50/85* (2023.02)

(56) References Cited

U.S. PATENT DOCUMENTS

| | | |
|---|---|---|
| 10,008,537 B2 | 6/2018 | Li |
| 2003/0076707 A1 | 4/2003 | Kim |
| 2010/0117121 A1 | 5/2010 | Rolbiecki |
| 2010/0208515 A1 | 8/2010 | Aoki |
| 2014/0339631 A1 | 11/2014 | Ting |
| 2015/0357376 A1 | 12/2015 | Seo |
| 2017/0170234 A1 | 6/2017 | Lee |
| 2017/0221541 A1* | 8/2017 | Jo .................... G11C 11/1657 |
| 2018/0151210 A1 | 5/2018 | Li |
| 2018/0174650 A1 | 6/2018 | Chung |
| 2019/0122799 A1 | 4/2019 | Shum |

* cited by examiner

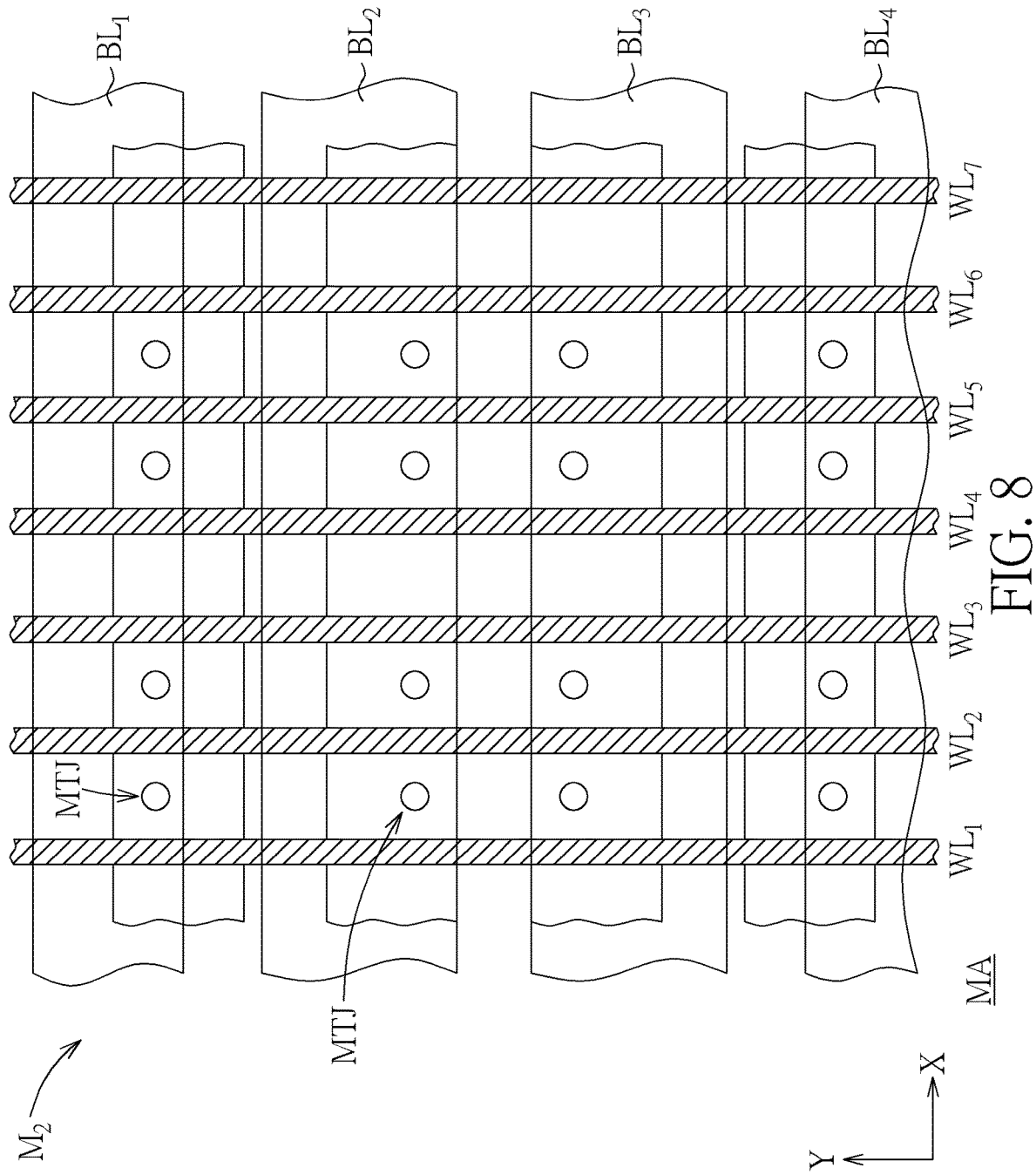

MAGNETIC MEMORY DEVICE HAVING SHARED SOURCE LINE AND BIT LINE

CROSS REFERENCE TO RELATED APPLICATIONS

This application is a continuation application of U.S. application Ser. No. 16/852,542, filed on Apr. 19, 2020. The content of the application is incorporated herein by reference.

BACKGROUND OF THE INVENTION

1. Field of the Invention

The invention relates to the technical field of semiconductor memory, in particular to a magnetoresistive random access memory (MRAM) with a shared source line (SL) and a shared bit line (BL).

2. Description of the Prior Art

As known in the art, spin-transfer torque magnetoresistive random access memory (STT-MRAM) is a non-volatile memory that has come under much scrutiny recently in the industry, which has several advantages over the conventional magnetoresistive random access memory. For example, these advantages include higher endurance, lower-power consumption, and faster operating speed.

In a magneto-tunnel junction (MTJ) including two ferromagnetic layers having a thin insulating layer therebetween, the tunnel resistance varies depending on the relative directions of magnetization of the two ferromagnetic layers. A magnetoresistive random access memory may be a semiconductor device where magnetic elements (MTJ elements) having MTJs utilizing a tunnel magneto resistance (TMR) effect are arranged in a matrix form as a memory cell.

In conventional designs, the source lines (SL) of the MTJ bit cell arrays are arranged to be parallel to the bit line (BL). However, in conventional designs there is no direct and parallel overlap between the source line and bit line due to via and metal spacing rules. Therefore, the minimum bit cell size of conventional designs cannot be reduced or minimized as a result of metal and via spacing rules.

Because the memory includes hundreds of thousands of cells, even small area savings in each cell can result in major advantages in density of the memory. Accordingly, it is highly desirable to provide apparatus and a method of improving the density of MRAM cells in a memory array by reducing the area of individual MRAM cells.

SUMMARY OF THE INVENTION

The present invention provides an improved magnetic memory device having a shared source line (SL) and a shared bit line (BL), which can solve the shortcomings of the prior art.

One aspect of the invention provides a memory device including a substrate; a plurality of active areas extending along a first direction on the substrate; a gate line traversing the active areas and extending along a second direction that is not parallel to the first direction; a plurality of source doped regions in the active areas and on a first side of the gate line, wherein the plurality of source doped regions are substantially aligned along the second direction; a main source line extending along the first direction; a source line extension coupled to the main source line and extending along the second direction, wherein the source line extension elongates from opposite side edges of the main source line and electrically connects the plurality of source doped regions with the main source line; a plurality of drain doped regions in the active areas and on a second side of the gate line that is opposite to the first side; and a plurality of data storage elements electrically coupled to the drain doped regions, respectively.

According to some embodiments, each of the plurality of data storage elements comprises a magnetic tunneling junction (MTJ) element.

According to some embodiments, the MTJ element comprises a bottom electrode.

According to some embodiments, the memory device further includes a landing pad disposed directly under the MTJ element.

According to some embodiments, the memory device further includes a drain contact electrically connecting the landing pad to each of the plurality of drain doped regions.

According to some embodiments, the bottom electrode is electrically connected to the landing pad.

According to some embodiments, the MTJ element comprises a top electrode.

According to some embodiments, the top electrode is electrically connected to a bit line.

According to some embodiments, the bit line extends along the first direction.

According to some embodiments, the memory device further includes a first dielectric layer disposed on the substrate, wherein the landing pad is disposed in the first dielectric layer and is situated in a first horizontal plane; and a second dielectric layer covering the first dielectric layer and the landing pad, wherein the MTJ element is disposed in the second dielectric layer, and wherein the main source line and the source line extension are situated in a second horizontal plane.

According to some embodiments, the second horizontal plane is lower than the first horizontal plane.

Another aspect of the invention provides a magnetic memory device including a substrate; an active area extending along a first direction on the substrate; an isolation region disposed in the substrate and adjacent to the active area; a plurality of gate lines traversing the active area and the isolation region along a second direction that is not parallel to the first direction, wherein the plurality of gate lines comprises a first gate line, a second gate line, and a third gate line between the first gate line and the second gate line; a first source doped region in the active area and on one side of the first gate line; a first drain doped region in the active area and between the first gate line and the third gate line; a second source doped region in the active area and on one side of the second gate line; a second drain doped region in the active area and between the second gate line and the third gate line; a main source line extending along the first direction overlying the isolation region; a first source line extension and a second source line extension coupled to the main source line and extending along the second direction, wherein the man source line is electrically connected to the first source doped region and the second source doped region via the first source line extension and the second source line extension, respectively; a first magnetic tunneling junction (MTJ) element electrically coupled to the first drain doped region; and a second MTJ element electrically coupled to the second drain doped region.

According to some embodiments, the first MTJ element and the second MTJ element are aligned along the first direction.

According to some embodiments, the first MTJ element and the second MTJ element are not aligned along the first direction.

According to some embodiments, the first MTJ element comprises a first bottom electrode and the second MTJ element comprises a second bottom electrode.

According to some embodiments, the magnetic memory device further includes a first landing pad and a second landing pad disposed directly under first MTJ element and the second MTJ element, respectively.

According to some embodiments, the magnetic memory device further includes a first drain contact electrically connecting the first landing pad to the first drain doped region; and a second drain contact electrically connecting the second landing pad to the second drain doped region.

According to some embodiments, the first bottom electrode is electrically connected to the first landing pad and the second bottom electrode is electrically connected to the second landing pad.

According to some embodiments, the first MTJ element comprises a first top electrode and the second MTJ element comprises a second top electrode.

According to some embodiments, the first top electrode and the second top electrode are electrically connected to a bit line.

According to some embodiments, the bit line extends along the first direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 8 is a layout diagram showing part of bit lines of the magnetic memory device in FIG. 7.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
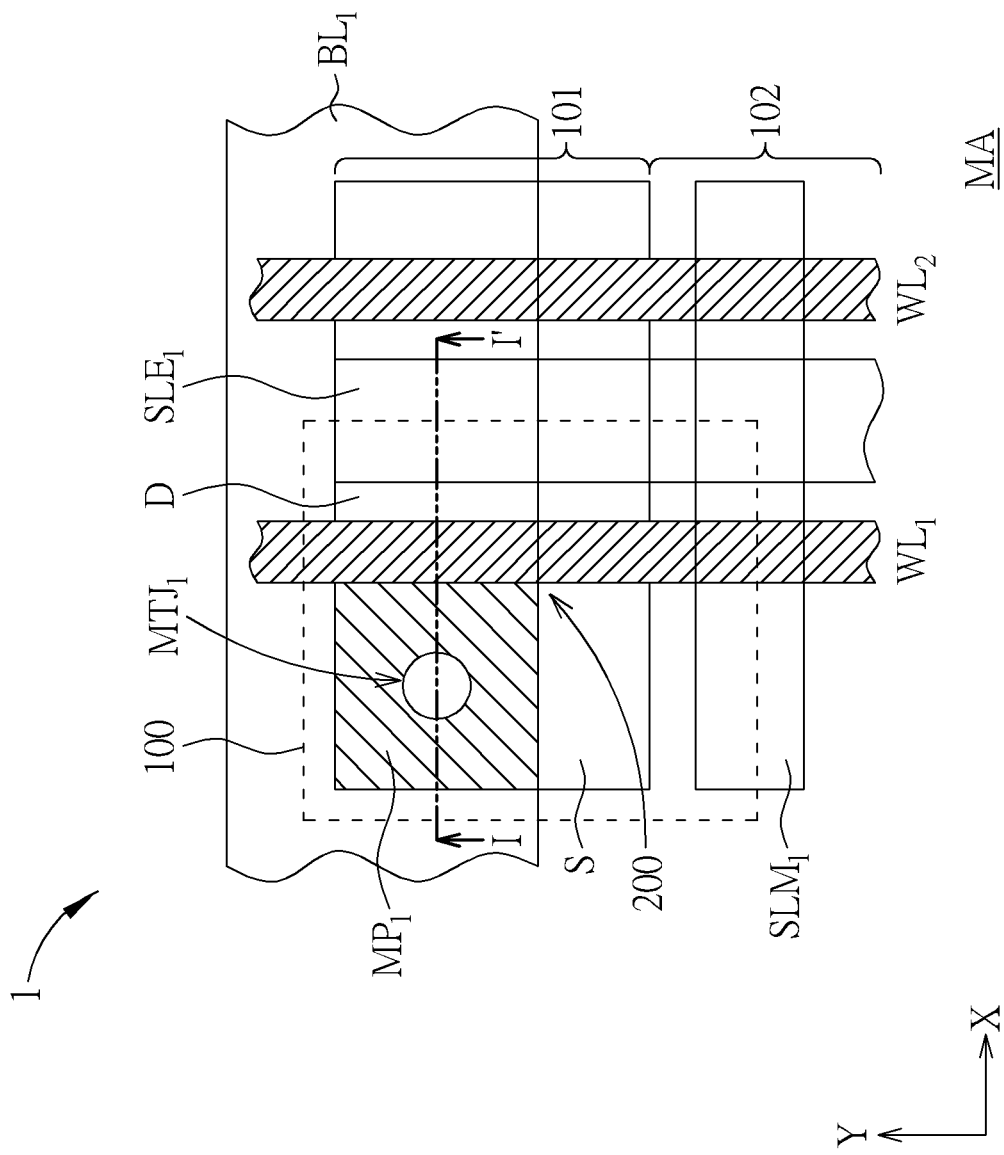
FIG. 1 is a schematic diagram of a partial layout of a magnetic memory device according to an embodiment of the invention.
Figure 2:
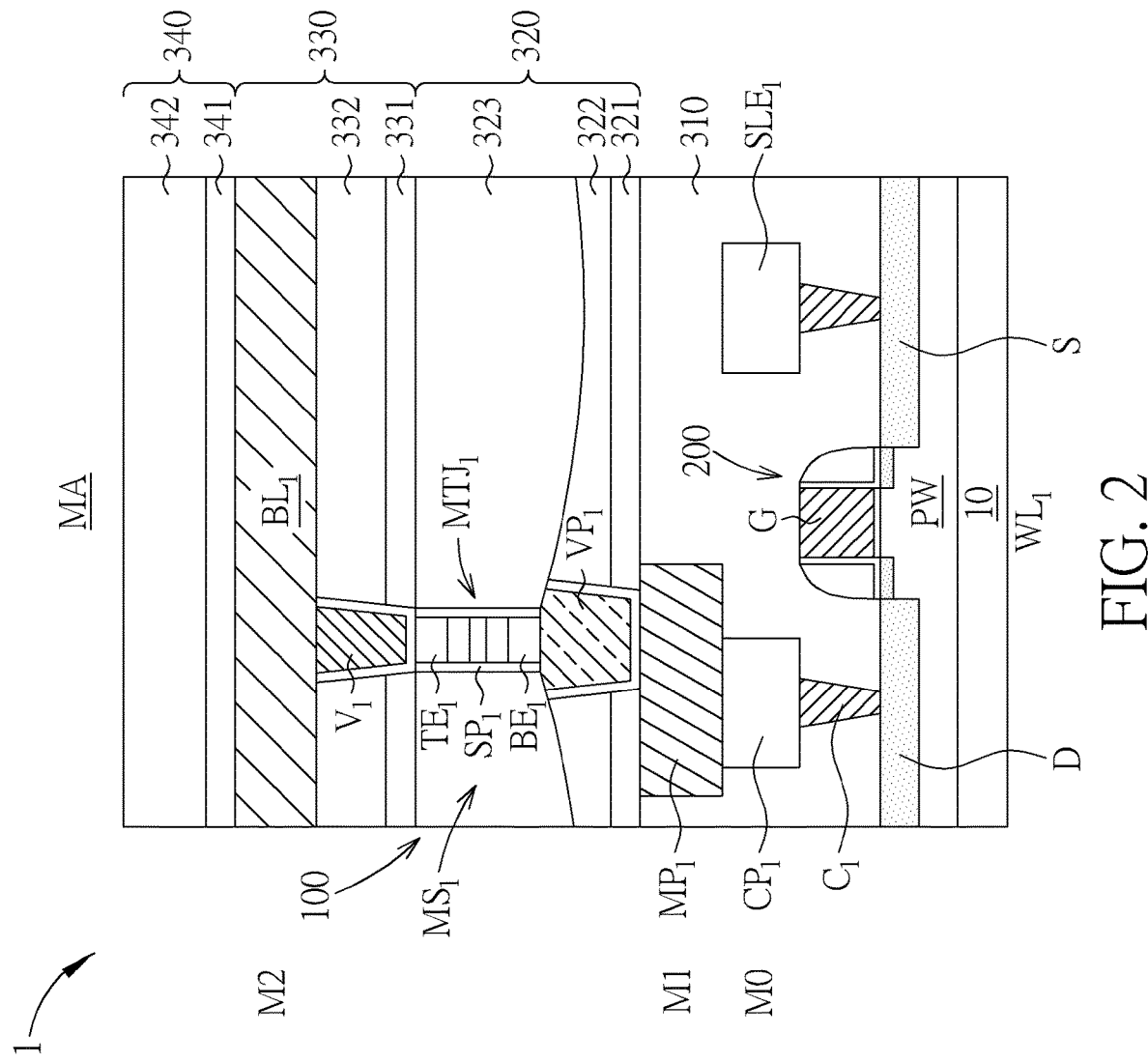
FIG. 2 is a cross-sectional view taken along line I-I' in FIG. 1.

Please refer to FIG. 1 and FIG. 2, wherein FIG. 1 is a schematic diagram of a partial layout of a magnetic memory device 1 according to an embodiment of the invention, and FIG. 2 is a cross-sectional view taken along line I-I' in FIG. 1. According to an embodiment of the present invention, as shown in FIGS. 1 and 2, the magnetic memory device 1 includes a substrate 10, for example, a P-type silicon substrate, but it is not limited thereto. According to an embodiment of the present invention, a P-well (PW) may be provided in the substrate 10, but is not limited thereto. The substrate 10 has a memory array area MA. In the memory array area MA on the substrate 10, memory cells 100 arranged in an array are provided. On the substrate 10, there are a plurality of strip-shaped and mutually parallel active areas 101 (FIG. 1 only shows one active area 101). The strip-shaped active areas 101 are isolated from one another by the strip-shaped shallow trench isolation (STI) region 102 (FIG. 1 only shows one STI region 102). According to an embodiment of the present invention, the strip-shaped active area 101 and the strip-shaped STI area 102 both extend along a first direction (for example, the reference X-axis direction).

According to an embodiment of the present invention, there are a plurality of gate lines or word lines on the substrate 10 (only two word lines $WL_1$ and $WL_2$ are shown in FIG. 1), which traverse the active area 101 and extend in a second direction (for example, the reference Y-axis direction) that is not parallel to the first direction. For example, the first direction is orthogonal to the second direction. According to an embodiment of the present invention, the word lines $WL_1$ and $WL_2$ may be polysilicon word lines, but not limited thereto. According to an embodiment of the present invention, the magnetic memory device 1 further includes a selection transistor 200 located at a position where the word line $WL_1$ crosses the active area 101, for example. According to an embodiment of the present invention, the selection transistor 200 may include a gate G, a drain doped region D, and a source doped region S. For example, the overlapping portion of the word line $WL_1$ and the active area 101 is the gate G of the selection transistor 200.

According to an embodiment of the present invention, the drain doped region D and the source doped region S are formed in the active areas 101 on two opposite sides of the gate G, respectively. For example, the drain doped region D and the source doped region S may be N-type doped regions or P-type doped regions. The source doped region S is provided on the first side of the gate line $WL_1$. The drain doped region D is disposed on the second side of the gate line $WL_1$ opposite to the first side.

As shown in FIG. 2, dielectric layers 310-340 are provided on the substrate 10, but not limited thereto. For example, the dielectric layer 310 may be an ultra-low dielectric constant (ultra-low k) material layer. For example, the ultra-low k material layer may be a carbon-containing silicon oxide (SiOC) layer having a dielectric constant ranging from 1 to 2.5, but is not limited thereto. According to an embodiment of the present invention, the dielectric layer 310 may be composed of a single layer of insulating material or multiple layers of insulating film. The dielectric layer 310 covers the memory array area MA and the selection transistor 200. According to an embodiment of the invention, the dielectric layer 320 covers the dielectric layer 310. For example, the dielectric layer 320 may include a nitrogen-doped silicon carbide (NDC) layer 321, a silicon oxide layer 322 on the NDC layer 321, and an ultra-low k material layer 323 on the silicon oxide layer 322. For example, the silicon oxide layer 322 may be a TEOS silicon oxide layer. The TEOS silicon oxide layer refers to a silicon oxide layer deposited using tetraethoxysilane (TEOS) as a reactive gas.

According to an embodiment of the present invention, a dielectric layer 330 and a dielectric layer 340 may be formed on the dielectric layer 320. The dielectric layer 330 may include, for example, a NDC layer 331 and an ultra-low k material layer 332. The dielectric layer 340 may include, for example, a NDC layer 341 and an ultra-low k material layer 342.

As shown in FIG. 1 and FIG. 2, the magnetic memory device 1 may further include a landing pad $MP_1$. The landing pad $MP_1$ overlaps the drain doped region D of the selection transistor 200. In addition, the landing pad $MP_1$ may partially overlap the word line $WL_1$. According to an embodiment of the invention, the landing pad $MP_1$ is disposed in the dielectric layer 310.

According to an embodiment of the present invention, as shown in FIG. 2, the landing pad $MP_1$ is located at a first horizontal plane and is electrically connected to the drain doped region D of the selection transistor 200. According to an embodiment of the invention, the landing pad $MP_1$ is located in a first metal (M1) layer. According to an embodiment of the invention, the first metal layer is a damascene copper layer. The landing pad $MP_1$ may be electrically coupled to the drain doped region D of the selection transistor 200 via a contact plug (drain contact) $C_1$. For example, the contact plug $C_1$ may be a tungsten metal plug. According to an embodiment of the present invention, between the landing pad $MP_1$ and the contact plug $C_1$, a contact pad $CP_1$ may be further provided. The contact pad $CP_1$ may be a tungsten metal contact pad, and may be formed in the zeroth metal (M0) layer.

The magnetic memory device 1 further includes a data storage element, for example, cylindrical memory stack $MS_1$. The cylindrical memory stack $MS_1$ may be arranged in an array, and the cylindrical memory stack $MS_1$ is aligned with the landing pad $MP_1$. According to an embodiment of the present invention, FIG. 2 illustrates the via plug $VP_1$ disposed in the silicon oxide layer 322 and the NDC layer 321. According to an embodiment of the present invention, FIG. 2 further illustrates a cylindrical memory stack $MS_1$ provided in the second dielectric layer 320. According to an embodiment of the present invention, the cylindrical memory stack $MS_1$ may include a bottom electrode $BE_1$ electrically coupled to the landing pad $MP_1$ through the via plug $VP_1$, and a top electrode $TE_1$ electrically coupled to the bit line $BL_1$ in the third dielectric layer 330 through the via $V_1$.

According to an embodiment of the present invention, as shown in FIG. 2, the via plug $VP_1$ is electrically connected to the bottom electrode $BE_1$ and the landing pad $MP_1$. According to an embodiment of the present invention, the via plug $VP_1$ may be a tungsten via plug, but is not limited thereto. According to an embodiment of the present invention, the bit line $BL_1$ and the via $V_1$ may be a dual damascene copper metal structure formed in the third dielectric layer 330.

As shown in FIG. 2, the cylindrical memory stack $MS_1$ may include a magnetic tunnel junction element $MTJ_1$. According to an embodiment of the present invention, a spacer $SP_1$ may be provided on the sidewall of the cylindrical memory stack $MS_1$. According to an embodiment of the present invention, for example, the spacer $SP_1$ may be a silicon nitride spacer, but is not limited thereto.

According to an embodiment of the present invention, the bottom electrode $BE_1$ may include, for example, but not limited to, tantalum (Ta), platinum (Pt), copper (Cu), gold (Au), aluminum (Al), etc. The multi-layer structure of the magnetic tunnel junction element $MTJ_1$ is a well-known technique, so its details are omitted. For example, the magnetic tunnel junction element $MTJ_1$ may include a fixed layer, a free layer, and a capping layer, but not limited thereto. The fixed layer may be made of antiferromagnetic (AFM) materials, such as iron manganese (FeMn), platinum manganese (PtMn), iridium manganese (IrMn), nickel oxide (NiO), etc., to fix or restrict the direction of the magnetic moment of adjacent layers. The free layer may be composed of a ferromagnetic material, such as iron, cobalt, nickel or alloys thereof such as cobalt-iron-boron (CoFeB), but it is not limited thereto. According to an embodiment of the present invention, for example, the top electrode $TE_1$ may include a ruthenium (Ru) metal layer and a tantalum (Ta) metal layer, but is not limited thereto.

FIG. 1 illustrates a bit line $BL_1$ extending along the reference X axis. According to an embodiment of the present invention, as shown in FIG. 1, the bit line $BL_1$ partially overlaps the underlying strip-shaped active area 101. According to an embodiment of the present invention, the bit line $BL_1$ may be formed in an upper metal interconnection, for example, a second metal (M2) layer or a third metal (M3) layer.

As shown in FIG. 1 and FIG. 2, a main source line $SLM_1$ extending along the reference X axis direction and a source line extension $SLE_1$ extending along the reference Y axis direction are provided on the substrate 10. The source line extension $SLE_1$ is coupled to the main source line $SLM_1$. The extension direction of the source line extension $SLE_1$ is parallel to the word line $WL_1$ and orthogonal to the main source line $SLM_1$ and the bit line $BL_1$. As shown in FIG. 1, the source line extension $SLE_1$ is disposed between the word lines $WL_1$ and $WL_2$. As shown in FIG. 2, the illustrated source line extension $SLE_1$ is disposed in the first dielectric layer 310. The main source line $SLM_1$ is electrically connected to the source doped region S via the source line extension $SLE_1$.

According to an embodiment of the present invention, the illustrated main source line $SLM_1$ and source line extension $SLE_1$ may be located at a second horizontal plane. According to an embodiment of the present invention, for example, the second horizontal plane may be lower than the first horizontal plane. In other words, the source line extension $SLE_1$ as illustrated in FIG. 2 is lower than the landing pad $MP_1$. According to an embodiment of the present invention, the source line extension $SLE_1$ illustrated in FIG. 2 may be located in the M0 metal layer. According to an embodiment of the present invention, the M0 metal layer may be a tungsten metal layer.

Figure 3:
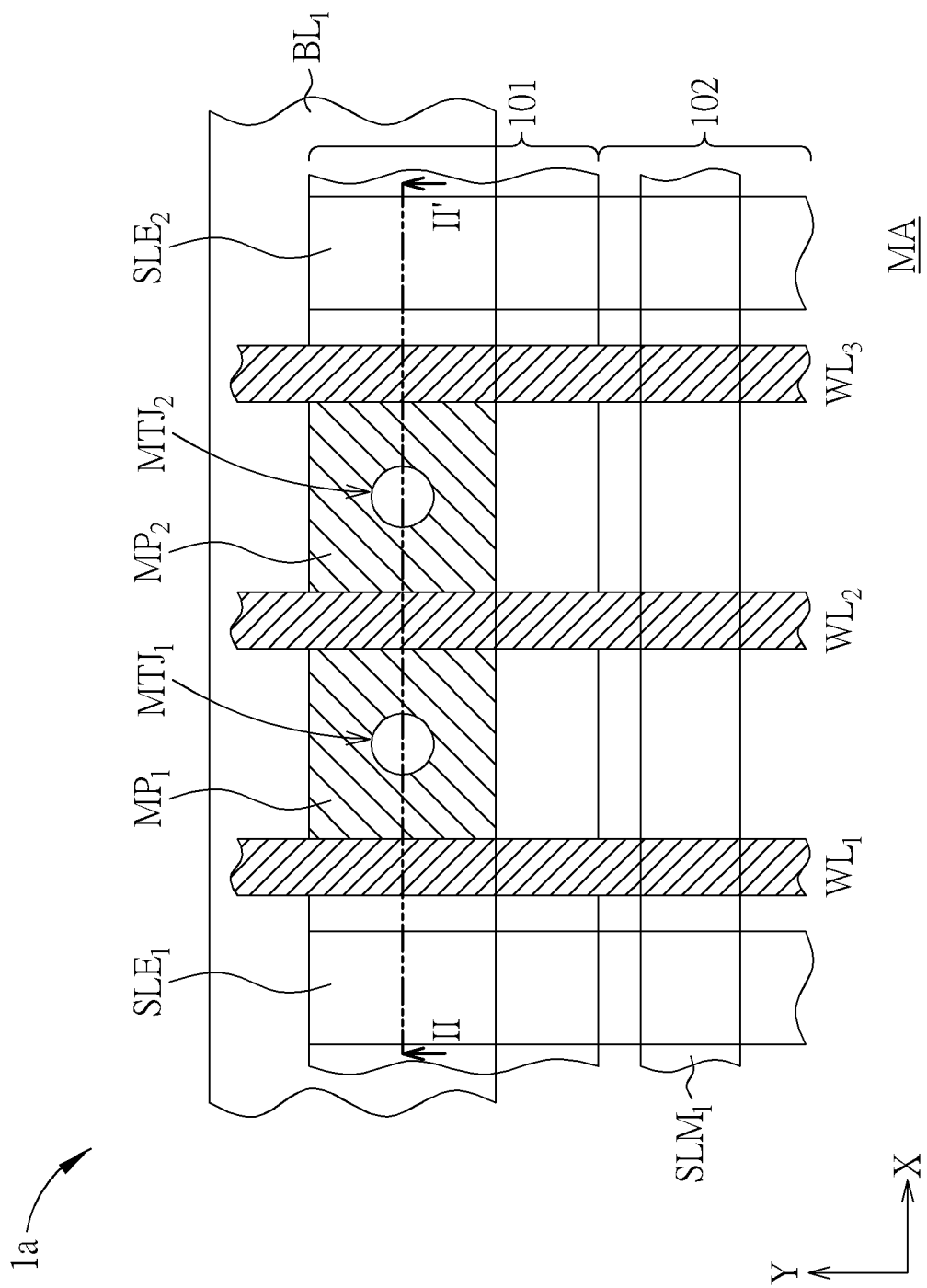
FIG. 3 is a schematic diagram showing a partial layout of a magnetic memory device according to another embodiment of the invention.
Figure 4:
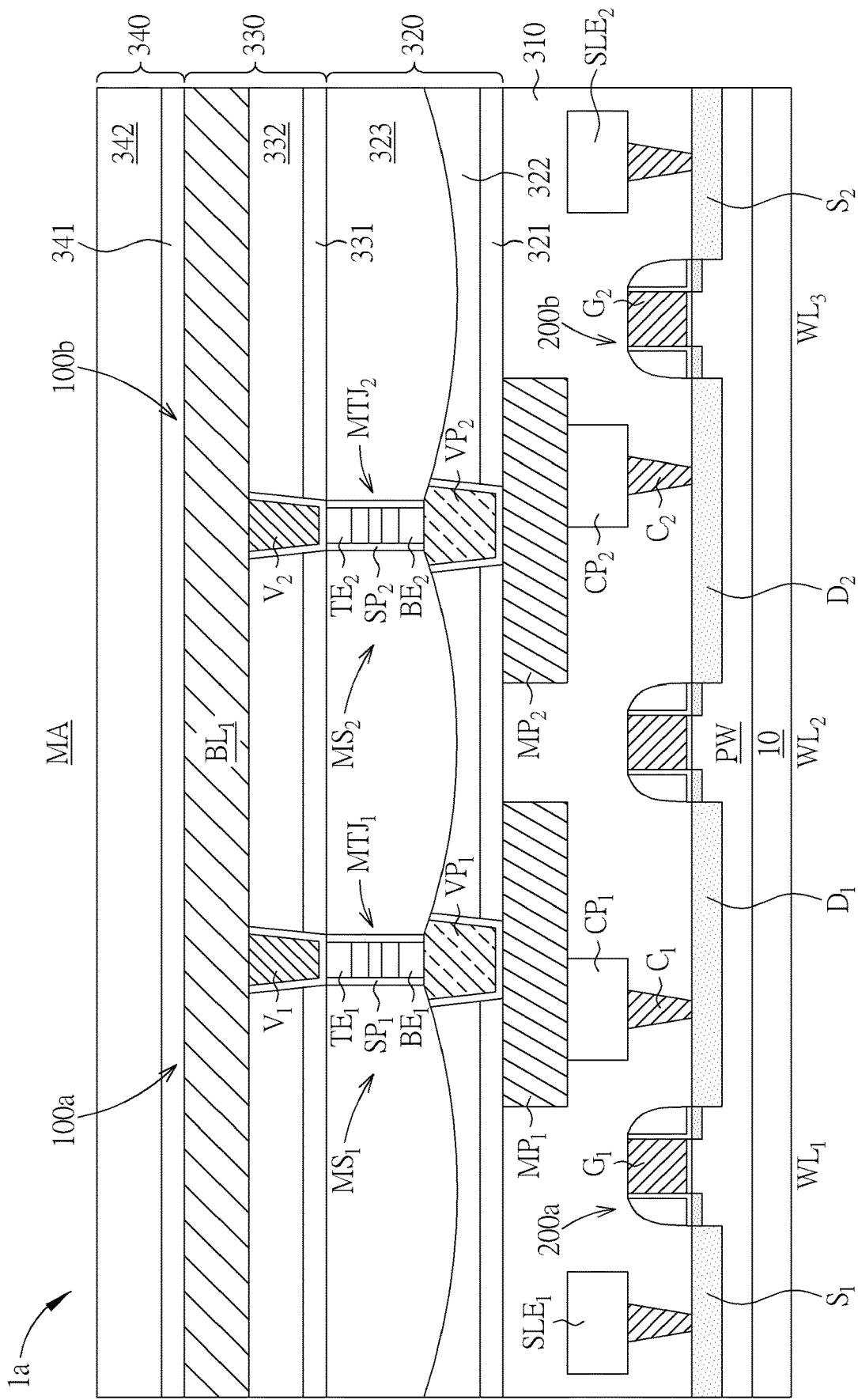
FIG. 4 is a cross-sectional view taken along line II-IF in FIG. 3.

Please refer to FIG. 3 and FIG. 4. FIG. 3 is a schematic diagram showing a partial layout of a magnetic memory device 1a according to another embodiment of the invention. FIG. 4 is a cross-sectional view taken along line II-IF in FIG. 3. According to an embodiment of the present invention, as shown in FIG. 3 and FIG. 4, the magnetic memory device 1a includes a substrate 10, for example, a P-type silicon substrate, but is not limited thereto. According to an embodiment of the present invention, a P-well (PW) may be provided in the substrate 10, but is not limited thereto. The substrate 10 has a memory array area MA. In the memory array area MA on the substrate 10, a plurality of memory cells 100a, 100b arranged in an array are provided. The substrate 10 comprises a plurality of strip-shaped and mutually parallel active areas 101 (only one active area 101 is shown in FIG. 3), which are isolated from one another by STI regions 102 (only one STI region 102 is shown in FIG. 3). According to an embodiment of the present invention, the strip-shaped active area 101 and the strip-shaped STI region 102 both extend along a first direction (for example, the reference X-axis direction).

According to an embodiment of the present invention, gate lines or word lines are disposed on the substrate 10 (only three word lines $WL_1$, $WL_2$, $WL_3$ are shown in FIG. 3), traversing the active area 101 and extending along a second direction (for example, the reference Y-axis direction) not parallel to the first direction. For example, the first direction is orthogonal to the second direction. According to an embodiment of the present invention, the word lines $WL_1$, $WL_2$, and $WL_3$ may be polysilicon word lines, but not limited thereto. According to an embodiment of the present invention, the magnetic memory device 1a further includes selection transistors 200a and 200b. For example, the selection transistor 200a is located at a position where the word line $WL_1$ crosses the active area 101, and the selection transistor 200b is located at a position where the word line $WL_3$ crosses the active area 101.

According to an embodiment of the present invention, the selection transistor 200a may include a gate $G_1$, a drain doped region $D_1$, and a source doped region $S_1$. For example, the portion where the word line $WL_1$ overlaps the active area 101 is the gate $G_1$ of the selection transistor 200a. According to an embodiment of the present invention, the selection transistor 200b may include a gate $G_2$, a drain doped region $D_2$, and a source doped region $S_2$. For example, the portion where the word line $WL_3$ overlaps the active area 101 is the gate $G_2$ of the selection transistor 200b.

According to an embodiment of the present invention, the drain doped region $D_1$ and the source doped region $S_1$ are formed in the active areas 101 on two sides of the gate $G_1$. For example, the drain doped region $D_1$ and the source doped region $S_1$ may be N-type doped regions or P-type doped regions. The source doped region $S_1$ is disposed on the first side of the word line $WL_1$. The drain doped region $D_1$ is disposed on the second side of the word line $WL_1$ opposite to the first side.

According to embodiments of the present invention, the drain doped region $D_2$ and the source doped region $S_2$ are formed in the active areas 101 on two sides of the gate $G_2$. For example, the drain doped region $D_2$ and the source doped region $S_2$ may be N-type doped regions or P-type doped regions. The source doped region $S_2$ is disposed on the first side of the word line $WL_3$. The drain doped region $D_2$ is disposed on the second side of the word line $WL_3$ opposite to the first side.

As shown in FIG. 4, dielectric layers 310-340 are provided on the substrate 10, but not limited thereto. For example, the dielectric layer 310 may be an ultra-low k material layer. For example, the ultra-low k material layer may be a carbon-containing silicon oxide layer having a dielectric constant ranging from 1 to 2.5, but not limited thereto. According to an embodiment of the present invention, the dielectric layer 310 may be composed of a single layer of insulating material or multiple layers of insulating film. The dielectric layer 310 covers the memory array area MA and the selection transistors 200a and 200b. According to an embodiment of the invention, the dielectric layer 320 covers the dielectric layer 310. For example, the dielectric layer 320 may include a NDC layer 321, a silicon oxide layer 322 on the NDC layer 321, and an ultra-low k material layer 323 on the silicon oxide layer 322. For example, the silicon oxide layer 322 may be a TEOS silicon oxide layer. The TEOS silicon oxide layer refers to a silicon oxide layer deposited using tetraethoxysilane as a reactive gas.

According to an embodiment of the present invention, a dielectric layer 330 and a dielectric layer 340 may be formed on the dielectric layer 320. The dielectric layer 330 may include, for example, a NDC layer 331 and an ultra-low k material layer 332, The dielectric layer 340 may include, for example, a NDC layer 341 and an ultra-low k material layer 342.

As shown in FIGS. 3 and 4, the magnetic memory device 1a may further include landing pads $MP_1$ and $MP_2$. The landing pad $MP_1$ overlaps the drain doped region $D_1$ of the selection transistor 200a, and the landing pad $MP_2$ overlaps the drain doped region $D_2$ of the selection transistor 200b. According to the embodiment of the invention, the landing pads $MP_1$ and $MP_2$ are disposed in the dielectric layer 310.

According to an embodiment of the present invention, as shown in FIG. 4, the landing pad $MP_1$ is located at a first horizontal plane and is electrically connected to the drain doped region $D_1$ of the selection transistor 200a, and the landing pad $MP_2$ is located at the first horizontal plane and is electrically connected to the drain doped region $D_2$ of the selection transistor 200b. According to an embodiment of the invention, the landing pads $MP_1$ and $MP_2$ are located in the M1 metal layer. According to an embodiment of the invention, the M1 metal layer is a damascene copper layer. The landing pads $MP_1$, $MP_2$ may be electrically coupled to the drain doped regions $D_1$, $D_2$ of the transistors 200a, 200b via contact plugs (drain contacts) $C_1$, $C_2$, respectively. For example, the contact plugs $C_1$ and $C_2$ may be tungsten metal plugs. According to the embodiment of the present invention, a contact pad $CP_1$ may be further provided between the landing pad MP' and the contact plug $C_1$, and a contact pad $CP_2$ may be further provided between the landing pad $MP_2$ and the contact plug $C_2$. The contact pads $CP_1$ and $CP_2$ may be tungsten metal contact pads, and may be formed in the M0 metal layer.

The magnetic memory device 1a further includes data storage elements, for example, cylindrical memory stacks $MS_1$, $MS_2$. The cylindrical memory stacks $MS_1$, $MS_2$ can be arranged in an array. The cylindrical memory stack $MS_1$ is aligned with the landing pad $MP_1$. The memory stack $MS_2$ is aligned with the landing pad $MP_2$. According to an embodiment of the present invention, FIG. 4 illustrates the via plugs $VP_1$ and $VP_2$ disposed in the silicon oxide layer 322 and the NDC layer 321. According to an embodiment of the present invention, FIG. 2 further illustrates cylindrical memory stacks $MS_1$ and $MS_2$ provided in the second dielectric layer 320. According to an embodiment of the present invention, the cylindrical memory stack $MS_1$ may include a bottom electrode $BE_1$ electrically coupled to the landing pad $MP_1$ through the via plug $VP_1$, and a top electrode $TE_1$ electrically coupled to the bit line $BL_1$ in the third dielectric layer 330 through the via $V_1$. According to an embodiment of the present invention, the cylindrical memory stack $MS_2$ may include a bottom electrode $BE_2$ electrically coupled to the landing pad $MP_2$ through the via plug $VP_2$, and a top electrode $TE_2$ electrically coupled to the bit line $BL_1$ in the third dielectric layer 330 through the via $V_2$.

According to an embodiment of the present invention, as shown in FIG. 4, the via plug $VP_1$ is electrically connected to the bottom electrode $BE_1$ and the landing pad $MP_1$, and the via plug $VP_2$ is electrically connected to the bottom electrode $BE_2$ and the landing pad $MP_2$. According to an embodiment of the present invention, the via plug $VP_2$ may be a tungsten metal via plug, but is not limited thereto. According to an embodiment of the present invention, the bit line $BL_1$ and the vias $V_1$ and $V_2$ may be composed of a dual damascene copper metal structure formed in the third dielectric layer 330.

As shown in FIG. 3, the cylindrical memory stacks $MS_1$, $MS_2$ may respectively include a magnetic tunnel junction element $MTJ_1$, $MTJ_2$. The magnetic tunnel junction elements $MTJ_1$ and $MTJ_2$ are aligned along the first direction. In some embodiments, the magnetic tunnel junction elements $MTJ_1$ and $MTJ_2$ may not be aligned along the first direction. According to an embodiment of the present invention, a spacer $SP_1$ may be provided on the sidewall of the cylindrical memory stack $MS_1$, and a spacer $SP_2$ may be provided on the sidewall of the cylindrical memory stack $MS_2$. According to an embodiment of the present invention, for example, the spacers $SP_1$ and $SP_2$ may be silicon nitride spacers, but not limited thereto.

According to embodiments of the present invention, the bottom electrodes $BE_1$, $BE_2$ may include, for example, but not limited to, Ta, Pt, Cu, Au, Al, or the like. The multi-layer structure of the magnetic tunnel junction elements $MTJ_1$ and $MTJ_2$ is a well-known technique, so the details are omitted. For example, the magnetic tunnel junction element MTh may include a fixed layer, a free layer, and a capping layer, but not limited thereto. The fixed layer may be composed of antiferromagnetic materials, such as iron manganese, platinum manganese, iridium manganese, nickel oxide, etc., to fix or limit the direction of the magnetic moment of the adjacent layers. The free layer may be composed of a ferromagnetic material, such as iron, cobalt, nickel or alloys thereof such as cobalt iron boron, but not limited thereto. According to an embodiment of the present invention, for example, the top electrodes $TE_1$ and $TE_2$ may include a ruthenium metal layer and a tantalum metal layer, but not limited thereto.

FIG. 3 illustrates a bit line $BL_1$ extending along the reference X axis. According to an embodiment of the present invention, as shown in FIG. 3, the bit line $BL_1$ partially overlaps the strip-shaped active area 101 below. According to an embodiment of the present invention, the bit line $BL_1$ may be formed in an upper metal interconnection, for example, the M2 metal layer or the M3 metal layer.

As shown in FIG. 3 and FIG. 4, a main source line $SLM_1$ extending along the reference X-axis direction directly above the STI region 102 and source line extensions $SLE_1$, $SLE_2$ extending along the reference Y-axis direction are provided on the substrate 10. The source line extensions $SLE_1$, $SLE_2$ are coupled to the main source line $SLM_1$. The extension directions of the source line extensions $SLE_1$ and $SLE_2$ are parallel to the word line $WL_1$ and orthogonal to the main source line $SLM_1$ and the bit line $BL_1$. As shown in FIG. 3, the source line extension $SLE_1$ is provided on one side of the word line $WL_1$. As shown in FIG. 4, the illustrated source line extensions $SLE_1$ and $SLE_2$ are provided in the first dielectric layer 310. The main source line $SLM_1$ is electrically connected to the source doped regions $S_1$, $S_2$ via source line extensions $SLE_1$, $SLE_2$.

According to an embodiment of the present invention, the illustrated main source line $SLM_1$ and source line extensions $SLE_1$, $SLE_2$ may be located at a second horizontal plane. According to an embodiment of the present invention, for example, the second horizontal plane may be lower than the first horizontal plane. In other words, the source line extensions $SLE_1$, $SLE_2$ as illustrated in FIG. 4 are lower than the landing pads $MP_1$, $MP_2$. According to an embodiment of the present invention, the source line extensions $SLE_1$ and $SLE_2$ illustrated in FIG. 4 may be located in the M0 metal layer. According to an embodiment of the present invention, the M0 metal layer may be a tungsten metal layer.

Figure 5:
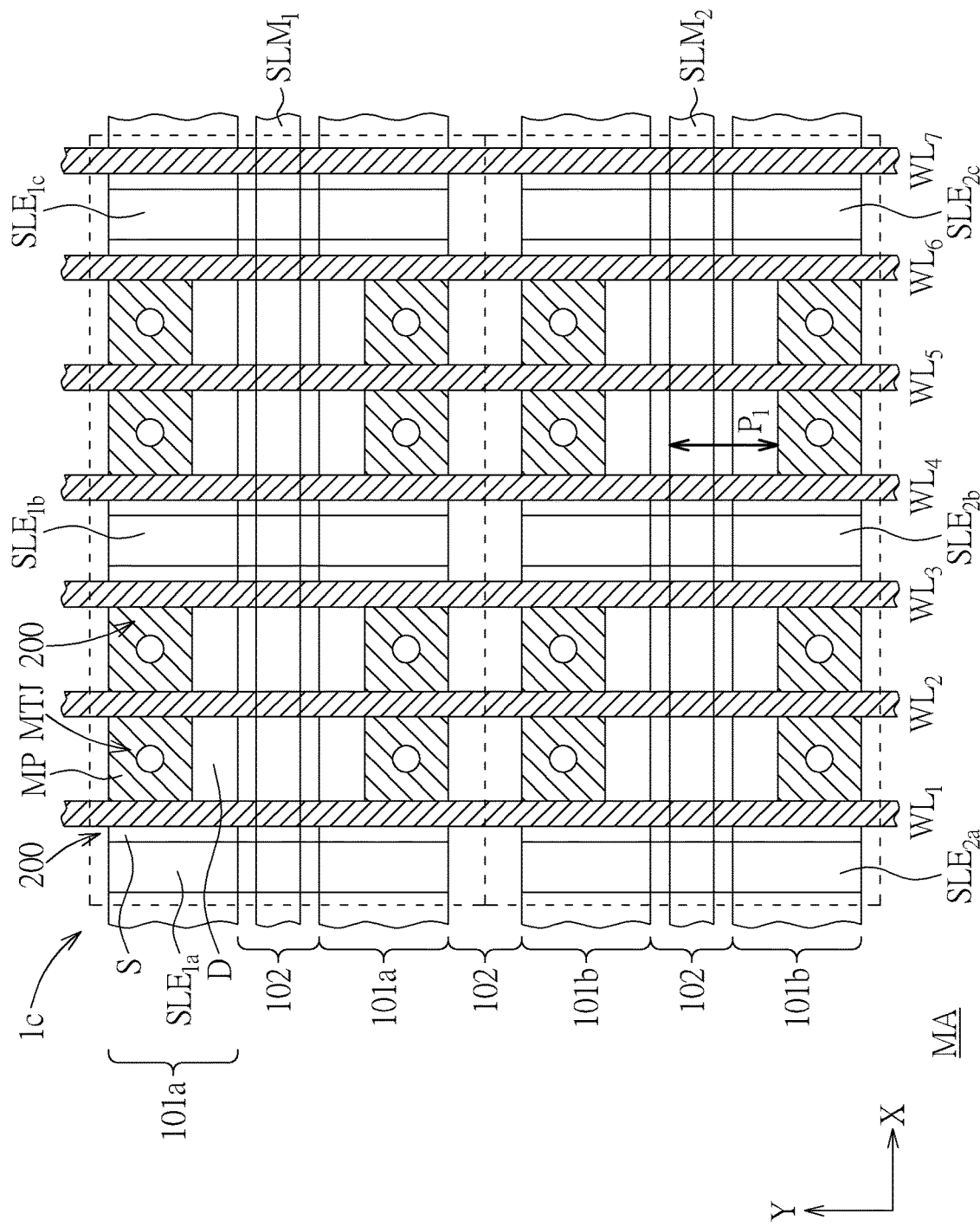
FIG. 5 is a schematic diagram of a partial layout of a magnetic memory device according to another embodiment of the present invention, illustrating part of the shared source lines.
Figure 6:
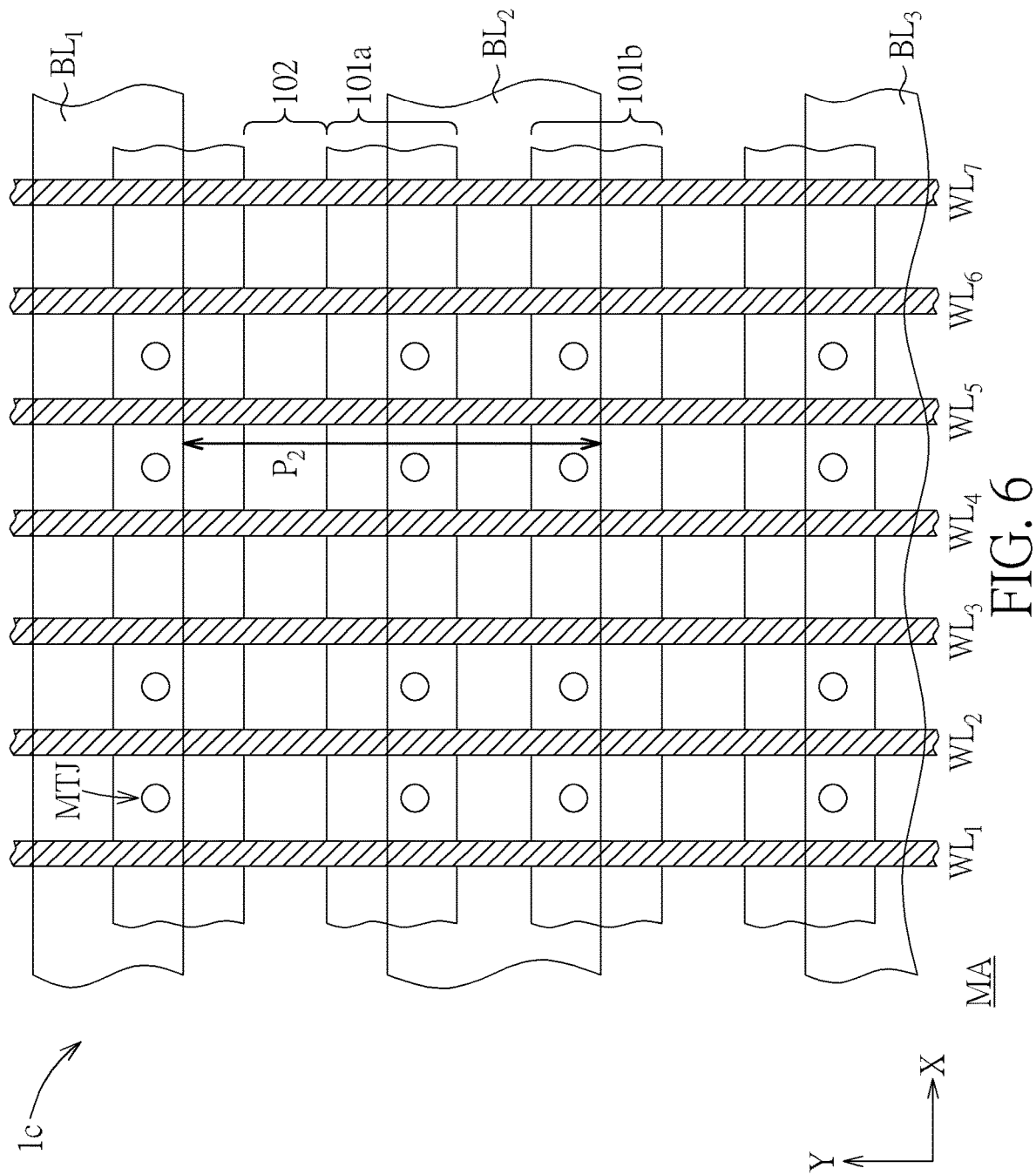
FIG. 6 is a layout diagram showing part of bit lines of the magnetic memory device in FIG. 5.

Please refer to FIG. 5 and FIG. 6. FIG. 5 is a schematic diagram of a partial layout of a magnetic memory device 1c according to another embodiment of the present invention, illustrating part of the shared source lines. FIG. 6 is a layout diagram showing part of bit lines of the magnetic memory device 1c in FIG. 5.

As shown in FIG. 5 and FIG. 6, likewise, strip-shaped and mutually parallel active areas 101a, 101b are provided in the memory array area MA, and are separated from one another by strip-shaped STI regions 102. Two adjacent active areas 101a are grouped into the first group, and two adjacent active areas 101b are grouped into the second group. Therefore, there are multiple groups of active areas in the memory array area MA. According to an embodiment of the present invention, the strip-shaped active areas 101a, 101b and the strip-shaped STI region 102 both extend along the first direction (for example, the reference X-axis direction).

According to an embodiment of the present invention, the magnetic memory device 1c further includes multiple gate lines or word lines $WL_1$~$WL_7$, traversing the active areas 101a, 101b and extending along the second direction (for example, reference Y-axis direction) that is not parallel to the first direction. For example, the first direction is orthogonal to the second direction. According to an embodiment of the present invention, the word lines $WL_1$~$WL_7$ may be polysilicon word lines, but not limited thereto.

At predetermined positions on the active areas 101a and 101b, a landing pad MP at a first horizontal plane and a data storage element containing a magnetic tunnel junction element MTJ (as described in FIG. 2) are provided and electrically connected to the corresponding drain doped region D of the selection transistor 200. Above the active area 101a of the first group, the magnetic memory device 1c further includes a main source line $SLM_1$ extending along the reference X-axis direction, and source line extensions $SLE_{1a}$~$SLE_{1c}$ extending along the reference Y-axis direction. The source line extensions $SLE_{1a}$~$SLE_{1c}$ are coupled to the main source line $SLM_1$. The extension directions of the source line extensions $SLE_{1a}$~$SLE_{1c}$ are parallel to the word line $WL_1$~$WL_7$ and orthogonal to the main source line $SLM_1$. The main source line $SLM_1$ is electrically connected to the source doped regions S of the selection transistors 200 provided on the active area 101a of the first group via source line extensions $SLE_{1a}$~$SLE_{1c}$.

Similarly, above the active area 101b of the second group, the magnetic memory device 1c further includes a main source line $SLM_2$ extending along the reference X-axis direction, and source line extensions $SLE_{2a}$~$SLE_{2c}$ extending along the reference Y-axis direction. The source line extensions $SLE_{2a}$~$SLE_{2c}$ are coupled to the main source line $SLM_2$. The extension directions of the source line extensions $SLE_{2a}$~$SLE_{2c}$ are parallel to the word line $WL_1$~$WL_7$ and orthogonal to the main source line $SLM_2$. The main source line $SLM_2$ is electrically connected to the source doped regions S of the selection transistors 200 provided on the active area 101b of the second group via source line extensions $SLE_{2a}$~$SLE_{2c}$.

According to an embodiment of the present invention, the illustrated main source lines $SLM_1$, $SLM_2$ and source line extensions $SLE_{1a}$~$SLE_{1c}$, $SLE_{2a}$~$SLE_{2c}$ may be located at the second horizontal plane. According to an embodiment of the present invention, for example, the second horizontal plane may be lower than the first horizontal plane where the landing pad MP is located. In other words, the illustrated main source lines $SLM_1$, $SLM_2$ and source line extensions $SLE_{1a}$~$SLE_{1c}$, $SLE_{2a}$~$SLE_{2c}$ are lower than the landing pad MP. According to embodiments of the present invention, the illustrated main source lines $SLM_1$, $SLM_2$ and source line extensions $SLE_{1a}$~$SLE_{1c}$, $SLE_{2a}$~$SLE_{2c}$ may be located in the M0 metal layer. According to an embodiment of the present invention, the M0 metal layer may be a tungsten metal layer.

As shown in FIG. 6, the bit lines $BL_1$~$BL_3$ of the magnetic memory device 1c are disposed between different groups of active areas and extend along the first direction, and the bit lines $BL_1$~$BL_3$ partially overlap the underlying strip-shaped active areas 101a and 101b. For example, the bit line $BL_2$ is disposed between the active area 101a of the first group and the active area 101b of the second group, and the magnetic tunnel junction elements MTJ provided on the active area 101a and the active area 101b are electrically connected to the bit line $BL_2$. The bit lines $BL_1$~$BL_3$ may be formed in the upper metal interconnection, for example, the M2 metal layer or the M3 metal layer. By using the above-mentioned shared source line and shared bit line configuration, a wider pitch $P_1$ between the source line and the landing pad can be released (as shown in FIG. 5), and a wider bit line pitch $P_2$ can be released (as shown in FIG. 6).

Figure 7:
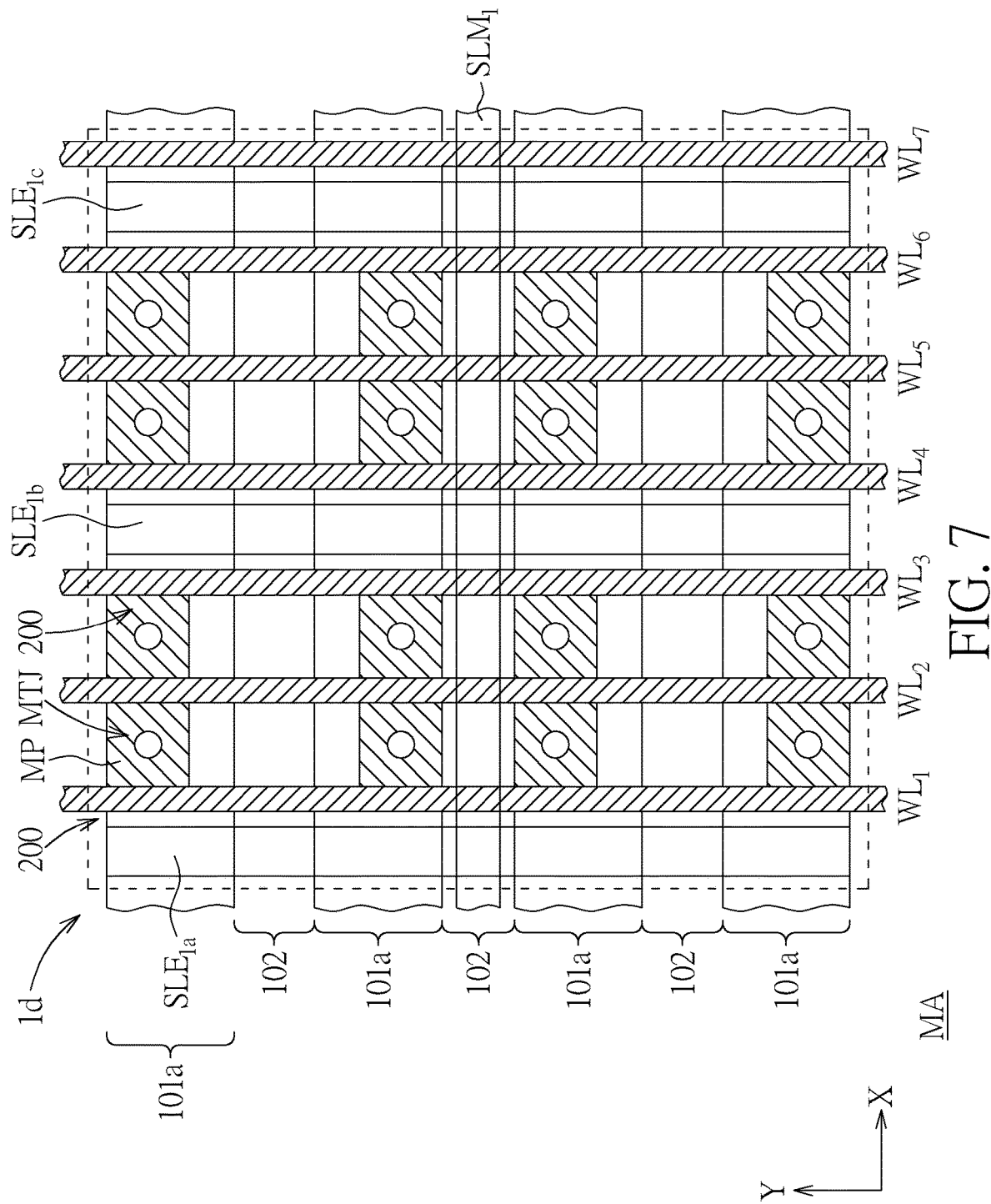
FIG. 7 is a partial layout diagram of a magnetic memory device according to another embodiment of the present invention, illustrating part of the shared source lines.

Please refer to FIG. 7 and FIG. 8. FIG. 7 is a partial layout diagram of a magnetic memory device 1d according to another embodiment of the present invention, illustrating part of the shared source lines. FIG. 8 is a layout diagram showing part of bit lines of the magnetic memory device 1d in FIG. 7.

As shown in FIG. 7 and FIG. 8, four strip-shaped and mutually parallel active areas 101a are exemplified in the memory array area MA, and are separated from each other by the strip-shaped STI region 102. In the array area MA, every four adjacent active areas 101a are divided into a group. Therefore, there can be multiple groups of active areas in the memory array area MA. According to an embodiment of the present invention, the strip-shaped active area 101a and the strip-shaped STI area 102 both extend along the first direction (for example, the reference X-axis direction).

In FIG. 7, four adjacent active areas 101a in the same group share a main source line $SLM_1$ extending along the reference X-axis direction. The main source line $SLM_1$ is electrically connected the source doped region S of each selection transistor 200 provided on the active area 101a of the group via source line extensions $SLE_{1a}$~$SLE_{1c}$ extending along the reference Y-axis direction. In FIG. 8, the magnetic memory device 1d includes bit lines $BL_1$~$BL_4$ extending along the first direction. The bit lines $BL_1$, $BL_4$ are disposed between different groups of active areas, and the bit lines $BL_1$, $BL_4$ may partially overlap with the strip-shaped active area 101a. For example, the bit line $BL_2$ is disposed on the active area 101a, and the magnetic tunnel junction elements MTJ disposed on the active area 101a are all electrically connected to the bit line $BL_2$. The bit lines $BL_1$~$BL_4$ may be formed in the upper metal interconnection, for example, the M2 metal layer or the M3 metal layer.

Figure 9C:
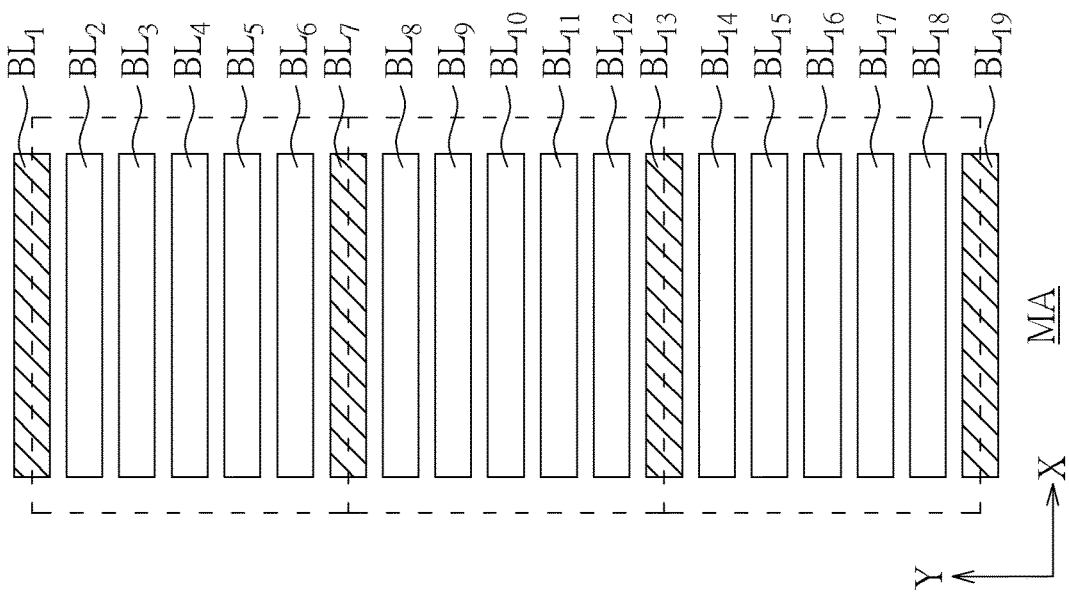
FIG. 9C illustrates the layout of the bit lines with respect to the three groups of active areas in FIG. 9A.
Figure 9B:
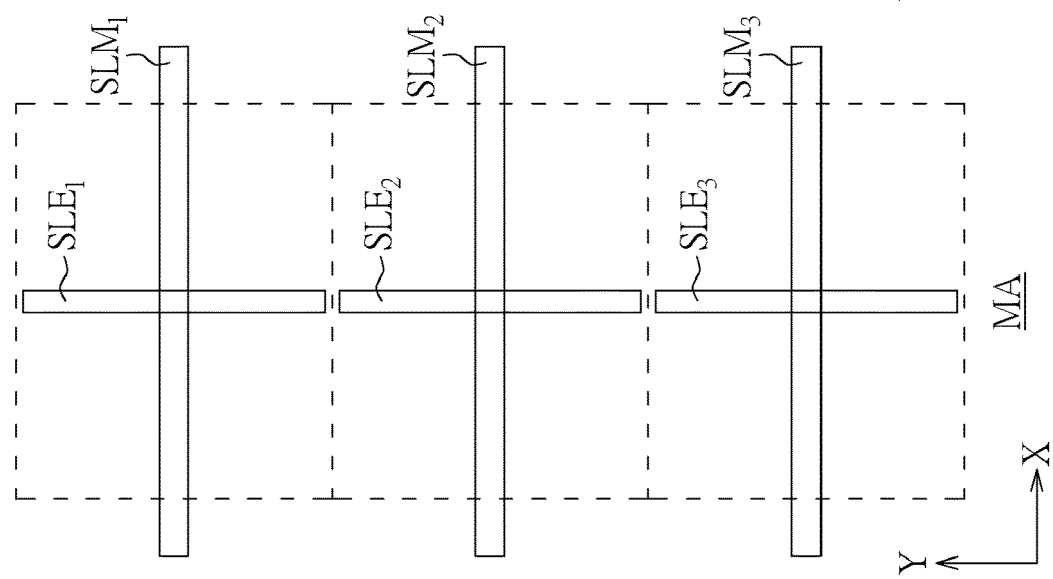
FIG. 9B illustrates the layout of the shared source line with respect to the three groups of active areas in FIG. 9A.
Figure 9A:
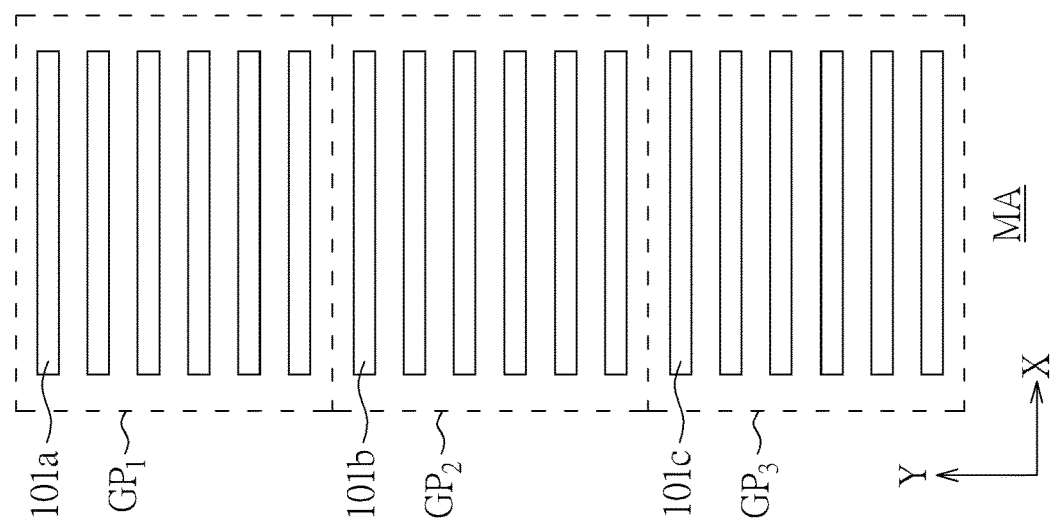
FIG. 9A illustrates the active areas divided in three groups in the memory array area.

Please refer to FIG. 9A to FIG. 9C. FIG. 9A illustrates the active areas divided in three groups in the memory array area MA. FIG. 9B illustrates the layout of the shared source line with respect to the three groups of active areas in FIG. 9A. FIG. 9C illustrates the layout of the bit lines with respect to the three groups of active areas in FIG. 9A. In FIG. 9A, the three groups of active areas $GP_1$~$GP_3$ are indicated by dotted lines, and each group includes n active areas 101a to 101c extending in the first direction (in FIG. 9A, n=6). In FIG. 9B, it is shown that the active areas in the first group $GP_1$ share a main source line $SLM_1$ extending along the reference X axis direction and a source line extension $SLE_1$ extending along the reference Y axis direction. The active areas in the second group $GP_2$ shares the main source line $SLM_2$ extending along the reference X-axis direction and a source line extension $SLE_2$ extending along the reference Y-axis direction. The active areas in the third group $GP_3$ share a main source line $SLM_3$ extending along the reference X-axis direction and a source line extension $SLE_3$ extending along the reference Y-axis direction. In FIG. 9C, a plurality of bit lines $BL_1$ to $BL_{19}$ extending along the reference X-axis direction are shown, where $BL_1$, $BL_7$, $BL_{13}$, and $BL_{19}$ are bit lines shared between different groups.

Figure 10:
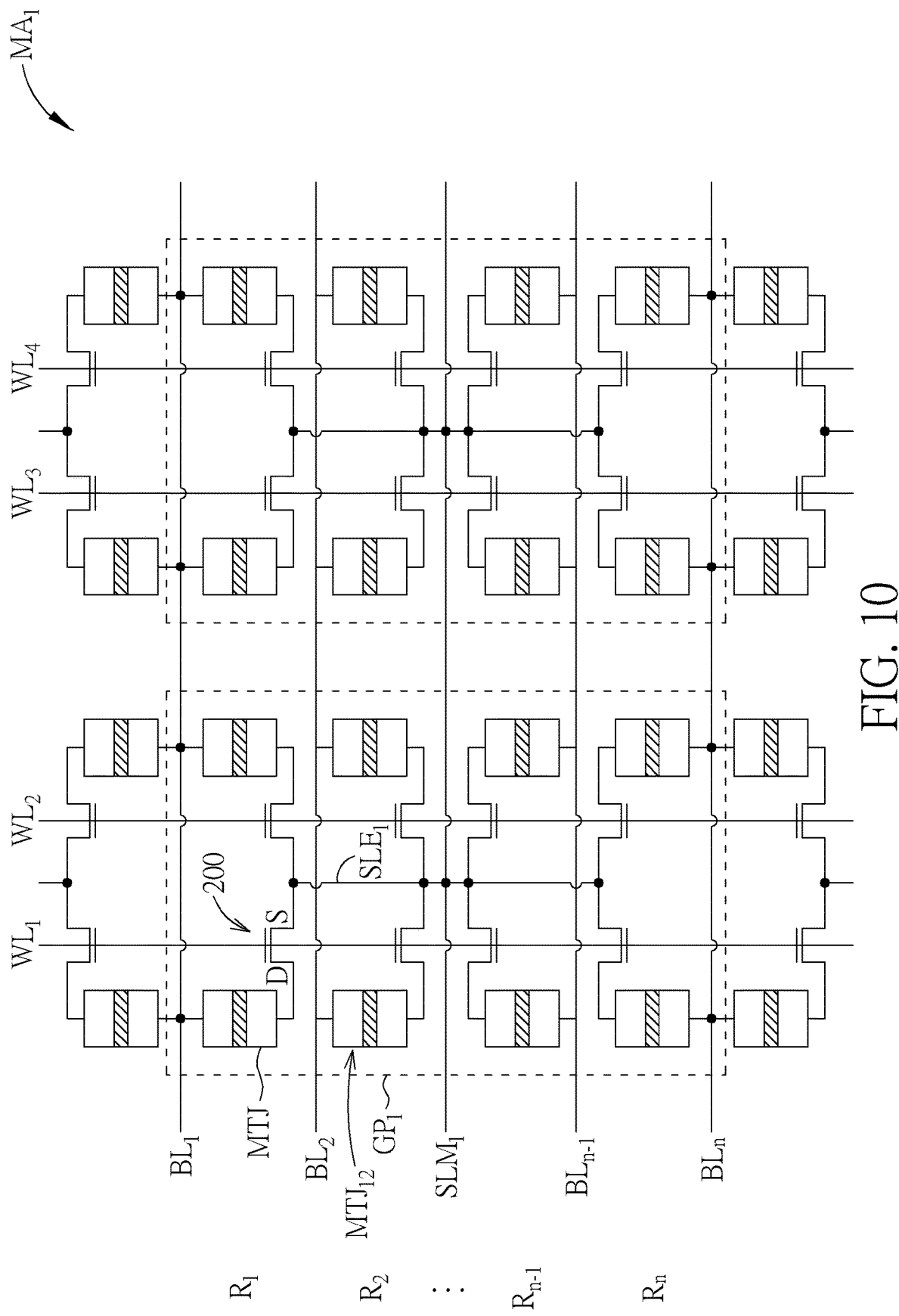
FIG. 10 is an equivalent circuit diagram of a single transistor single memory cell (1T1M) memory array according to another embodiment of the present invention.

Please refer to FIG. 10, which is an equivalent circuit diagram of a single transistor single memory cell (1T1M) memory array $MA_1$ according to another embodiment of the present invention. As shown in FIG. 10, the memory array $MA_1$ includes a plurality of selection transistors 200, which are respectively arranged in a plurality of rows $R_1$~$R_n$, where n may be an integer ranging between 2-8, for example, n=6, but is not limited thereto. The selection transistor 200 and the data storage element including the magnetic tunnel junction element MTJ together constitute a 1T1M configuration. FIG. 10 shows at least one group of active areas $GP_1$ for illustration purposes. The active areas in the group $GP_1$ share a main source line $SLM_1$ extending along the reference X axis direction and a source line extension $SLE_1$ extending along the reference Y axis direction. The group of active areas $GP_1$ is provided with a plurality of bit lines $BL_1$~$BL_n$ extending along the reference X-axis direction, where $BL_1$ and $BL_n$ are bit lines shared between different groups in the Y-axis direction.

The following illustrates an example of the read and write operation method of the 1T1M memory array $MA_1$ of FIG. 10. Taking the reading of the magnetic tunnel junction element $MTJ_{12}$ in FIG. 10 as an example, the reading operation conditions include: biasing the word line $WL_1$ to $V_{DD}$ and biasing the bit line $BL_2$ to a lower voltage, for example, 50 mV. The main source line $SLM_1$ and the source line extension $SLE_1$ are grounded. The other word lines are grounded. The other bit lines and main source lines are both floating.

To write the magnetic tunnel junction element $MTJ_{12}$ in FIG. 10 to a parallel state (0 state), the writing operation conditions include: biasing the word line $WL_1$ to $V_{DD}$ and biasing the bit line $BL_2$ to $V_{CC}$. The main source line $SLM_1$ and the source line extension $SLE_1$ are grounded. The other word lines are grounded. The other bit lines and main source lines are both floating.

To write the magnetic tunnel junction element $MTJ_{12}$ in FIG. 10 to the anti-parallel state (1 state), the writing operation conditions include: biasing the word line $WL_1$ to $V_{DD}$, grounding the bit line $BL_2$, and biasing the main source line $SLM_1$ and the source line extension $SLE_1$ to $V_{CC}$. The other word lines are grounded. The other bit lines and main source lines are both floating.

Figure 11:
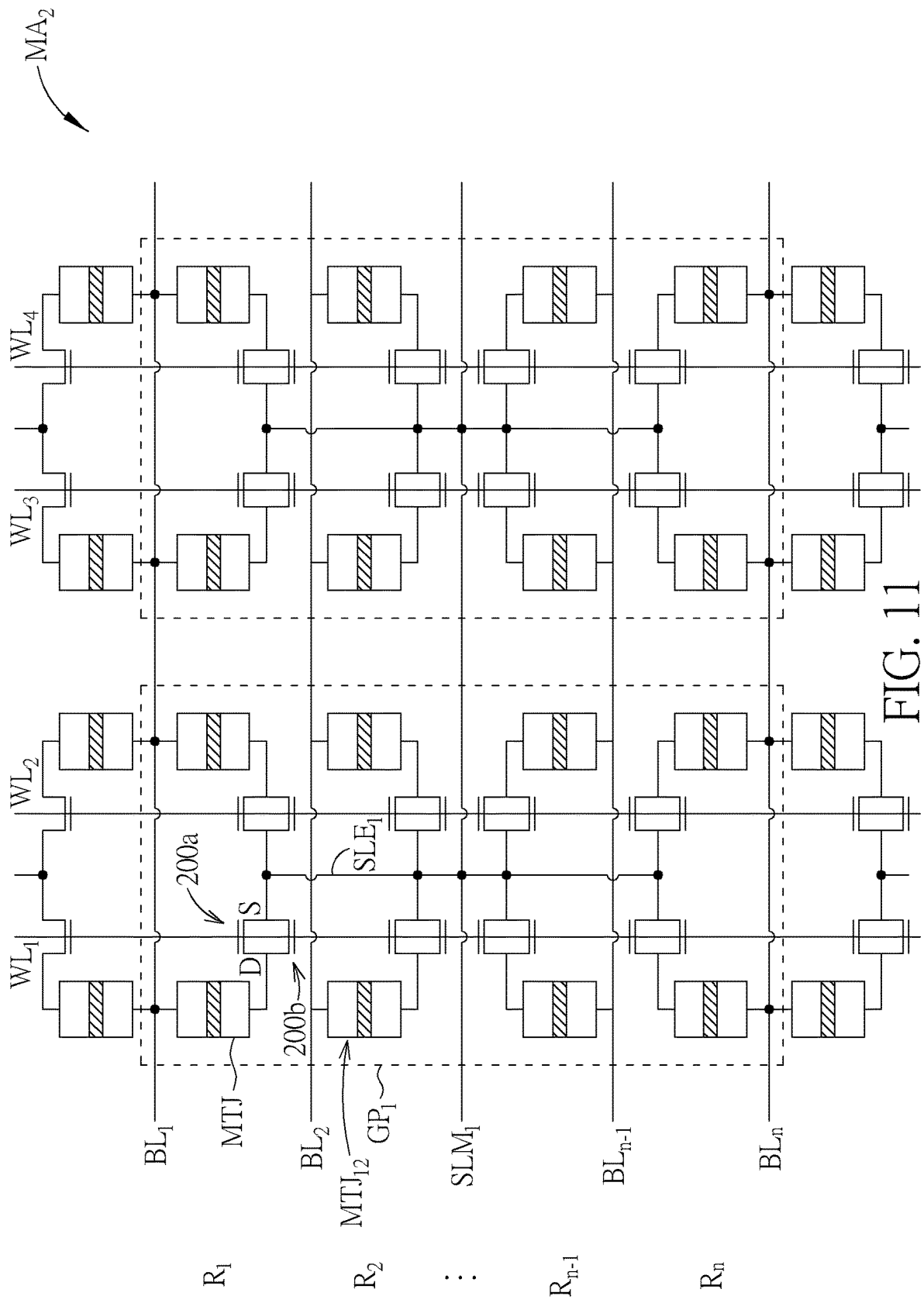
FIG. 11 is an equivalent circuit diagram of a dual transistor single memory cell (2T1M) memory array according to another embodiment of the present invention.

Please refer to FIG. 11, which is an equivalent circuit diagram of a dual transistor single memory cell (2T1M) memory array $MA_2$ according to another embodiment of the present invention. As shown in FIG. 11, the memory array $MA_2$ includes a plurality of selection transistors $200a$ and $200b$, which are respectively arranged in a plurality of rows $R_1 \sim R_n$, where n may be an integer ranging between 2-8, for example, n=6, but is not limited thereto. The two selection transistors $200a$, $200b$ and the data storage element containing the magnetic tunnel junction element MTJ together constitute a 2T1M configuration. FIG. 11 shows at least one group of active areas $GP_1$ for illustration purposes. The active areas in the group $GP_1$ share a main source line $SLM_1$ extending along the reference X-axis direction and a source line extension $SLE_1$ extending along the reference Y-axis direction. The group of active areas $GP_1$ is provided with a plurality of bit lines $BL_1 \sim BL_n$ extending along the reference X-axis direction, where $BL_1$ and $BL_n$ are bit lines shared between different groups in the Y-axis direction.

The following illustrates an example of the read and write operation method of the 2T1M memory array $MA_2$ of FIG. 11. Taking the reading of the magnetic tunnel junction element $MTJ_{12}$ in FIG. 11 as an example, the reading operation conditions include: biasing the word line $WL_1$ to $V_{DD}$, and biasing the bit line $BL_2$ to a lower voltage, for example, 50 mV. The main source line $SLM_1$ and the source line extension $SLE_1$ are grounded. The other word lines are grounded. The other bit lines and main source lines are both floating.

To write the magnetic tunnel junction element $MTJ_{12}$ in FIG. 11 to a parallel state (0 state), the writing operation conditions include: biasing the word line $WL_1$ to $V_{DD}$, and biasing the bit line $BL_2$ to $V_{CC}$. The main source line $SLM_1$ and the source line extension $SLE_1$ are grounded. The other word lines are grounded. The other bit lines and main source lines are both floating.

To write the magnetic tunnel junction element $MTJ_{12}$ in FIG. 11 to the anti-parallel state (1 state), the writing operation conditions include: biasing the word line $WL_1$ to $V_{DD}$, grounding the bit line $BL_2$, and biasing the main source line $SLM_1$ and the source line extension $SLE_1$ to $V_{CC}$. The other word lines are grounded. The other bit lines and main source lines are both floating.

Figure 12:
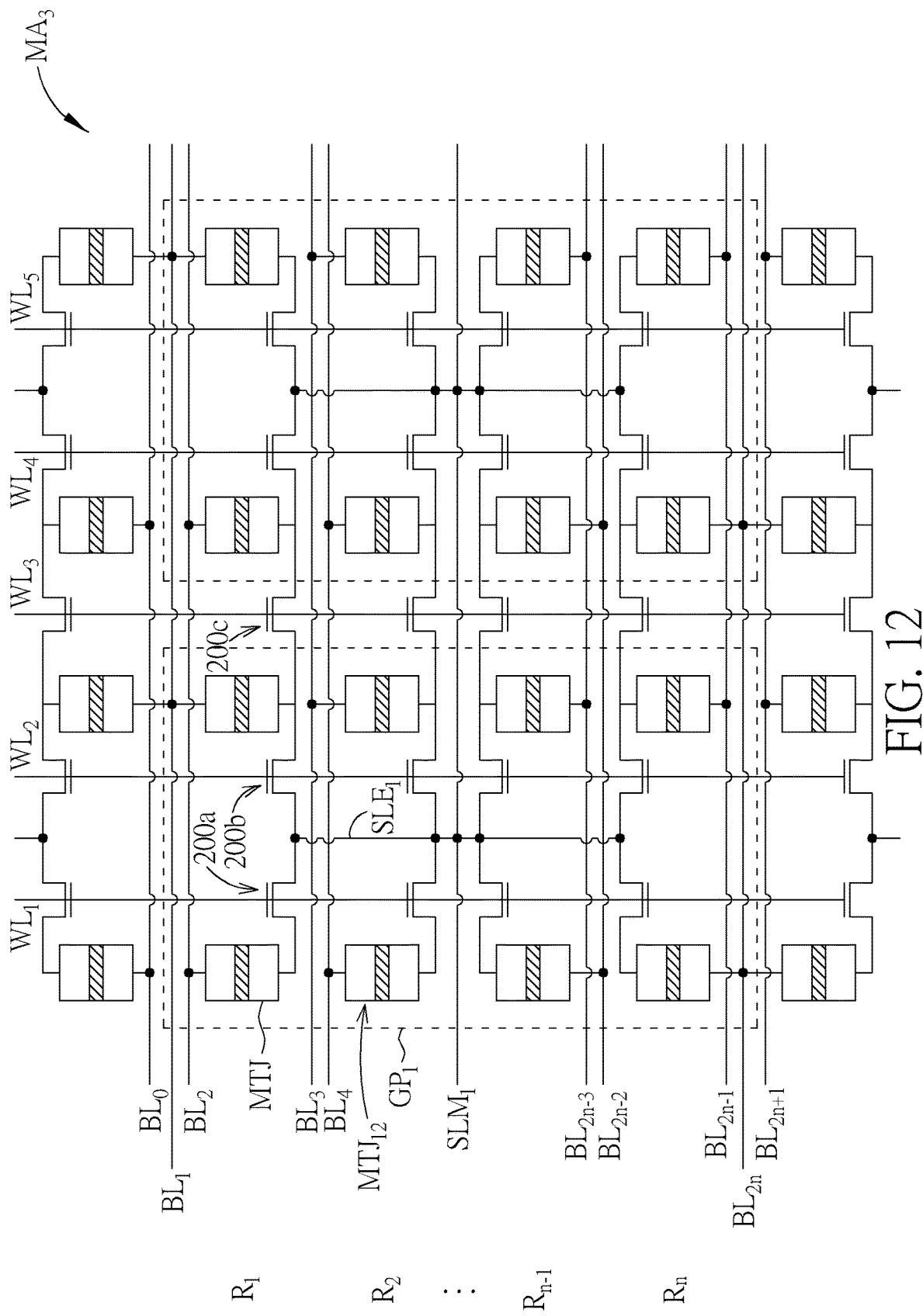
FIG. 12 is an equivalent circuit diagram of a triple transistor dual memory cell (3T2M) memory array according to another embodiment of the present invention.

Please refer to FIG. 12, which is an equivalent circuit diagram of a triple transistor dual memory cell (3T2M) memory array $MA_3$ according to another embodiment of the present invention. As shown in FIG. 12, the memory array $MA_3$ includes a plurality of selection transistors $200a$, $200b$, and $200c$, which are respectively arranged in a plurality of rows $R_1 \sim R_n$, where n may be an integer ranging between 2-8, for example, n=6, but is not limited to. The three selection transistors $200a$, $200b$, $200c$ and the two data storage elements including the magnetic tunnel junction element MTJ together constitute a 3T2M configuration. FIG. 12 shows at least one group of active areas $GP_1$ for illustration purposes. The active areas in the group $GP_1$ share a main source line $SLM_1$ extending along the reference X axis direction and a source line extension $SLE_1$ extending along the reference Y axis direction. The group of active areas $GP_1$ is provided with a plurality of bit lines $BL_1 \sim BL_{2n}$ extending along the reference X-axis direction, where $BL_1$ and $BL_{2n}$ are bit lines shared between different groups in the Y-axis direction.

The following illustrates an example of the read and write operation method of the 3T2M memory array $MA_3$ of FIG. 12. Taking the reading of the magnetic tunnel junction element $MTJ_{12}$ in FIG. 12 as an example, the reading operation conditions include: biasing the word lines $WL_1 \sim WL_3$ to $V_{DD}$ and biasing the bit line $BL_4$ to a lower voltage, for example 50 mV. The main source line $SLM_1$ and the source line extension $SLE_1$ are grounded. The other word lines are grounded. The other bit lines and main source lines are both floating.

To write the magnetic tunnel junction element $MTJ_{12}$ in FIG. 12 to a parallel state (0 state), the writing operation conditions include: biasing the word lines $WL_1 \sim WL_3$ to $V_{DD}$, and biasing the bit line $BL_4$ to $V_{CC}$, grounding the main source line $SLM_1$ and the source line extension $SLE_1$. The other word lines are grounded. The other bit lines and main source lines are both floating.

To write the magnetic tunnel junction element $MTJ_{12}$ in FIG. 12 to an anti-parallel state (1 state), the writing operation conditions include: biasing the word lines $WL_1 \sim WL_3$ to $V_{DD}$, and grounding the bit line $BL_4$, The main source line $SLM_1$ and the source line extension $SLE_1$ are biased to $V_{CC}$. The other word lines are grounded. The other bit lines and main source lines are both floating.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
   a substrate;
   a plurality of active areas extending along a first direction on the substrate;
   a gate line traversing the active areas and extending along a second direction that is not parallel to the first direction;
   a plurality of source doped regions in the active areas and on a first side of the gate line, wherein the plurality of source doped regions are substantially aligned along the second direction;
   a main source line extending along the first direction;
   a source line extension coupled to the main source line and extending along the second direction, wherein the source line extension elongates from opposite side edges of the main source line and electrically connects the plurality of source doped regions with the main source line;
   a plurality of drain doped regions in the active areas and on a second side of the gate line that is opposite to the first side; and
   a plurality of data storage elements electrically coupled to the drain doped regions, respectively.

2. The memory device according to claim 1, wherein each of the plurality of data storage elements comprises a magnetic tunneling junction (MTJ) element.

3. The memory device according to claim 2, wherein the MTJ element comprises a bottom electrode.

4. The memory device according to claim 3 further comprising:
a landing pad disposed directly under the MTJ element.

5. The memory device according to claim 4 further comprising:
a drain contact electrically connecting the landing pad to each of the plurality of drain doped regions.

6. The memory device according to claim 5, wherein the bottom electrode is electrically connected to the landing pad.

7. The memory device according to claim 3, wherein the MTJ element comprises a top electrode.

8. The memory device according to claim 7, wherein the top electrode is electrically connected to a bit line.

9. The memory device according to claim 8, wherein the bit line extends along the first direction.

10. The memory device according to claim 4 further comprising:
a first dielectric layer disposed on the substrate, wherein the landing pad is disposed in the first dielectric layer and is situated in a first horizontal plane; and
a second dielectric layer covering the first dielectric layer and the landing pad, wherein the MTJ element is disposed in the second dielectric layer, and wherein the main source line and the source line extension are situated in a second horizontal plane.

11. The memory device according to claim 10, wherein the second horizontal plane is lower than the first horizontal plane.

* * * * *